US011355368B2

(12) United States Patent
Lloyd

(10) Patent No.: US 11,355,368 B2
(45) Date of Patent: Jun. 7, 2022

(54) DECENTRALIZED SUBSTRATE HANDLING AND PROCESSING SYSTEM

(71) Applicant: Applied Materials, Inc., Santa Clara, CA (US)

(72) Inventor: Scott Gregory Lloyd, Austin, TX (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 50 days.

(21) Appl. No.: 16/946,964

(22) Filed: Jul. 13, 2020

(65) Prior Publication Data

US 2022/0013384 A1 Jan. 13, 2022

(51) Int. Cl.
*H01L 21/67* (2006.01)
*H01L 21/68* (2006.01)
*G01B 11/00* (2006.01)
*H01L 21/687* (2006.01)

(52) U.S. Cl.
CPC ...... *H01L 21/67196* (2013.01); *G01B 11/002* (2013.01); *H01L 21/67017* (2013.01); *H01L 21/68* (2013.01); *H01L 21/68764* (2013.01)

(58) Field of Classification Search
CPC ......... H01L 21/67196; H01L 21/67017; H01L 21/68; H01L 21/68764; G01B 11/002
See application file for complete search history.

(56) References Cited

U.S. PATENT DOCUMENTS 9,960,065 B2 * 5/2018 Kawasaki ......... H01L 21/67393
2014/0330422 A1 * 11/2014 Ranish ............. H01L 21/67248 700/121
2018/0374719 A1 * 12/2018 Waqar ............... H01L 21/67201
2018/0374725 A1 * 12/2018 Holeyannavar ... H01L 21/67775

FOREIGN PATENT DOCUMENTS

CN 100553102 C 10/2009
EP 0699606 B1 10/2001

OTHER PUBLICATIONS

Chen et al., "Development of a Contactless Air Conveyor System for Transporting and Positioning Planar Objects," Micromachines2018, 9, 487; doi:10.3390/mi9100487, www.mdpi.com/journal/micromachies, 21 pages, published Sep. 24, 2018.

(Continued)

*Primary Examiner* — Mohammed Shamsuzzaman
(74) *Attorney, Agent, or Firm* — Lowenstein Sandler LLP

(57) ABSTRACT

An electronics manufacturing system includes a first substrate transfer via having position detection sensors to detect a position of a substrate in the first substrate transfer via and flow-controlled valves to inject inert gas through a floor and move the substrate in a predetermined direction with reference to the position within the first substrate transfer via by adjusting a pressure of the inert gas underneath the substrate. A processing chamber is coupled to the first substrate transfer via and having a pedestal with apertures and flow-controlled devices to inject inert gas through the apertures to receive the substrate from the first substrate transfer via and move the substrate into a second substrate transfer via after processing of the substrate.

14 Claims, 9 Drawing Sheets

Controller
202
214
101
216
218
219

(56) References Cited

OTHER PUBLICATIONS

Dahroug et al., "Design, Modeling and Control of a Modular Contactless Wafer Handling System," Conference Paper in Proceedings-IEEE International Conference on Robotics and Automation, 7 pages, Jun. 2015.

Davis, Solomon, "A Contactless Acoustic Motor for Silicon Wafer Handling," Dynamic Laboratory, Technion, 22 pages.

ZS-Handling, "Touch-Free Handling," za-handling / handling technology / ultrasound bearings, https://www.zs-handlign.com/de/, 4 pages, retrieved on Nov. 10, 2019.

Poletkin, K., et al., "Hybrid Electromagnetic and Electrostatic Micromachined Suspension with Adjustable Dynamics," PowerMEMS 2015, IOP Publiishing, Journal of Phuscs: Conference Series 600 (2015) 012005, doi:10.1088/1742-6596/660/1/012005, 6 pages, 2015.

* cited by examiner

DECENTRALIZED SUBSTRATE HANDLING AND PROCESSING SYSTEM

TECHNICAL FIELD

Embodiments of the present disclosure relate to processing substrates, and more particularly, to a decentralized substrate handling and processing system.

BACKGROUND

A chip manufacturing facility is composed of a broad spectrum of technologies. Cassettes containing semiconductor substrates (e.g., wafers) are routed to various stations in a facility where they are either processed or inspected. Semiconductor processing generally involves the deposition of material onto and removal ("etching" and/or "planarizing") of material from substrates. Typical processes include chemical vapor deposition (CVD), plasma enhanced CVD (PECVD), physical vapor deposition (PVD), electroplating, chemical mechanical planarization (CMP), and etching, among others.

Concerns in semiconductor processing include substrate throughput and cost of processing. Generally, the greater the substrate throughput, the lower the manufacturing cost and therefore the lower the cost of the processed substrates. These factors are limited by the substrate processing system design. Cluster tools such as mainframes and factory interfaces occupy significant space and can support a limited number of chambers. The cluster tools are generally purchased regardless of number of chambers needed, with a base price of hundreds of thousands of dollars.

These cluster tools use articulating robots to move wafers within the system, e.g., in and out of chambers and/or reactors. This adds to cost, to reliability issues, as well as to contaminant particles due to moving parts. Robots occupy about 25% of a total footprint of the substrate processing system tool. Furthermore, the steps to move substrates from atmospheric conditions to vacuum conditions and back are time consuming, add defects, and add no value. The number of these moves is unnecessarily high due to the limitations of cluster tools. Additionally, due to limit of the number of process chambers, it can take over 1,000 steps to make most advanced chips, so current processing systems are generally inefficient.

SUMMARY

Some of the embodiments described herein cover an electronics manufacturing system including a first substrate transfer via having: multiple position detection sensors to detect a position of a substrate in the first substrate transfer via and multiple flow-controlled valves configured to: inject inert gas through a floor of the first substrate transfer via and move the substrate in a predetermined direction with reference to the position within the first substrate transfer via by adjusting a pressure of the inert gas underneath the substrate. A processing chamber is coupled to the first substrate transfer via and includes: a pedestal with multiple apertures and a multiple flow-controlled devices to: inject inert gas through the plurality of apertures to receive the substrate from the first substrate transfer via; and move the substrate into a second substrate transfer via after processing of the substrate.

In some embodiments, a processing chamber includes a pedestal having apertures, the pedestal sized to receive a substrate and including a first post. A flow-controlled device is to: inject inert gas, via the first post, through the apertures of the pedestal to receive the substrate on the pedestal from a first substrate transfer via for processing; and inject inert gas, via the first post, through the apertures of the pedestal to eject the substrate from the pedestal into a second substrate transfer via after processing of the substrate. A lower enclosure includes a second post, the lower enclosure adapted to receive the pedestal. A lift is physically connected to the lower enclosure and is to raise the lower enclosure into the processing chamber. An exhaust channel, formed within the second post, is to purge process waste after processing.

In some embodiments, a handling system includes a method for processing substrates, including injecting inert gas through a first set of flow-controlled valves and through a porous floor of a first substrate transfer via of an electronics manufacturing system, the inert gas pushing up beneath a substrate within the first substrate transfer via. Method may further include receiving, from a position detection sensors within the first substrate transfer via, positioning data of the substrate moving through the first substrate transfer via. The method may further include processing, by a controller coupled to the position detection sensors and to the first set of flow-controlled valves, the positioning data to determine a location of the substrate within the first substrate transfer via. The method may further include adjusting, by the controller, a pressure of the inert gas from at least some of the first set of flow-controlled valves to move the substrate in a predetermined direction with reference to the location toward a processing chamber coupled to the first substrate transfer via.

BRIEF DESCRIPTION OF THE DRAWINGS

The present disclosure is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

DETAILED DESCRIPTION OF EMBODIMENTS

Figure 1:
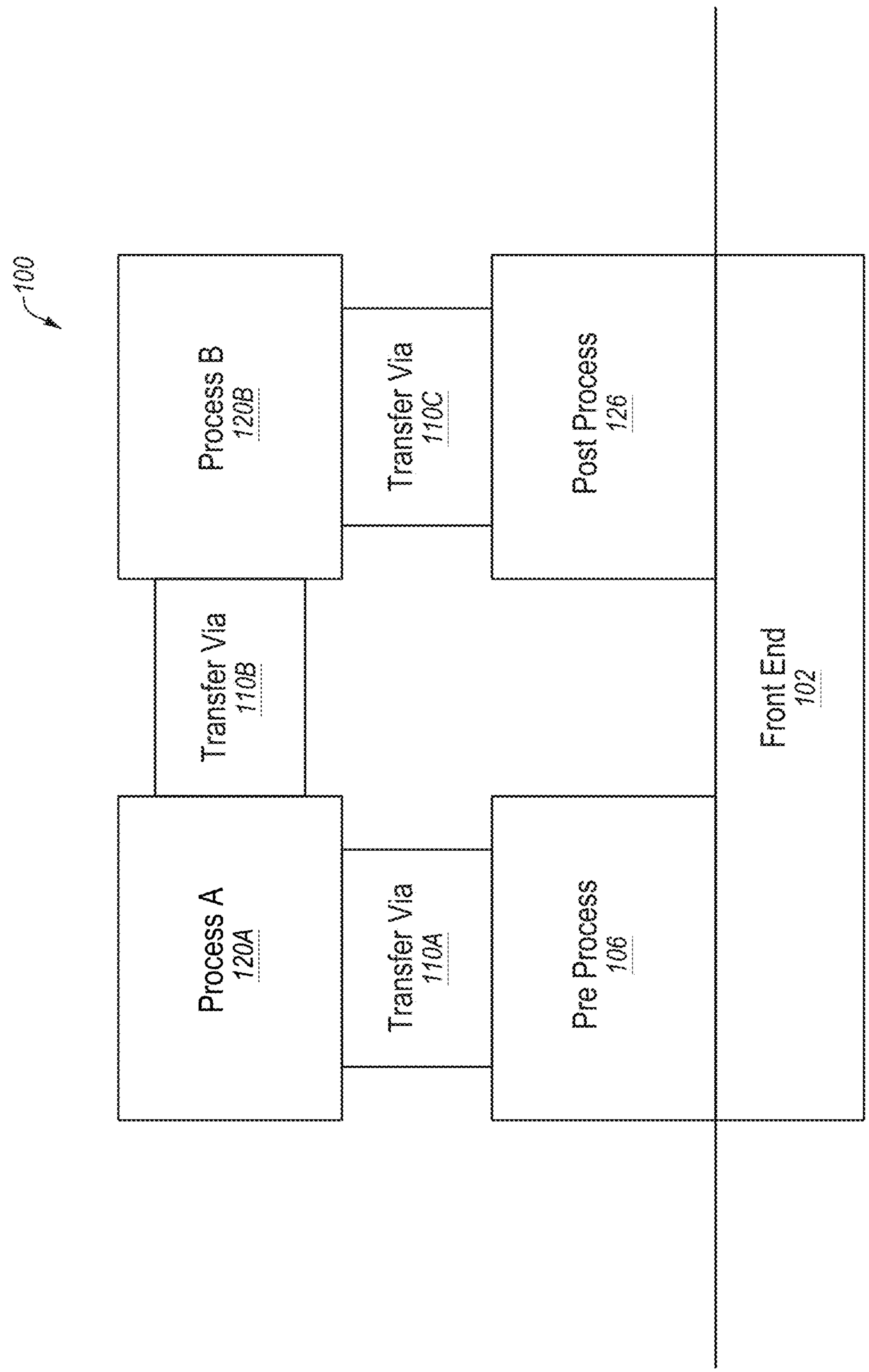
FIG. 1 illustrates a top view of a simplified substrate handling and processing system, according to one embodiment.

Embodiments described herein are related to a decentralized substrate handling and processing system and related methods. To resolve the deficiencies in current substrate processing systems that employ tool clusters, the present substrate handling and processing system transfers substrates along substrate transfer vias and/or in and out of processing chambers without use of robots. In one embodiment, the substrate handling and processing components instead use pressurized fluid, such as inert or non-reactive gas, along with position detection sensors to move the substrates through interconnecting substrate transfer vias and processing chambers. The present embodiments minimize moving parts, reliably transport the substrates, are serviceable, and extendable to different series of processing steps.

In some embodiments, the inert gas is Argon (Ar), Nitrogen ($N_2$), helium (He), or the like, and is supplied through flow-controlled valves attached to gas lines, channels, and/or tubes to surfaces in order to impart movement and control of the substrates. The inert gas may be recirculated so as not to be wasted. The pressure of the inert gas under a substrate may be altered based on the substrate's position in order to move the substrate within a substrate transfer via towards a destination such as a processing chamber. The substrate transfer vias may be at or near vacuum, and thus at a low pressure that facilitates ready movement of substrates using the insert gas. The processing chambers may also use pressurized gas (which may also be inert) in order to receive substrates for processing and then to eject the substrates into another substrate transfer via when processing is complete. By chaining substrate transfer vias with processing chambers, processing paths may be planned and executed in order to process the substrates in a prescribed order. Without the expense of substrate handling tools such as robots, many more substrate transfer vias and processing chambers may be employed, depending on application, including parallel processing through duplicate chambers in order to increase throughput.

In one embodiment, an electronics manufacturing system includes a number of substrate transfer vias, each including position detection sensors to detect a position of a substrate in the substrate transfer via. Each substrate transfer via may also include a first set of flow-controlled valves configured to inject inert gas through a floor of the substrate transfer via and move the substrate in a predetermined direction with reference to the position of the substrate within the substrate transfer via, e.g., by adjusting a pressure of the inert gas underneath the substrate or underneath a portion of the substrate.

In this and additional embodiments, the electronics manufacturing system includes one or more processing chambers, one of which is coupled to the above referenced substrate transfer via. The processing chamber may include a pedestal having multiple apertures and multiple flow-controlled devices to inject inert gas through the multiple apertures to receive the substrate from the first substrate transfer via, position the substrate onto a substrate support for processing, and move the substrate into a second substrate transfer via after processing of the substrate. In some embodiments, a lower enclosure is employed that is sized to receive the pedestal and fit into the processing chamber. A lift may be physically connected to the lower enclosure and adapted to raise the pedestal into the processing chamber after receipt of the substrate. An exhaust channel, formed at least in part within the lift, may purge process waste after processing of the substrate. A vacuum source may be coupled to the exhaust channel, the vacuum source to adjust a pressure level of the processing chamber. After processing is complete, the pressure level may be equalized with a pressure level of the neighboring substrate transfer vias in order to facilitate a smooth transfer of the substrate out of the processing chamber and into an outgoing substrate transfer via.

Advantages of embodiments of the present disclosure include, but are not limited to, minimizing moving parts, reliably transporting the substrates, and employing easily serviceable modular units that are extendable to a different series of processing steps. The present embodiments further reduce cost and complexity in eliminating complex robots and mechatronics. The present embodiments involve a flexible, extendable architecture that can match the process steps for any specific electronic component or system that is being created. Further, the elimination of moving parts reduces contaminant particles and resultant device damage risks. Additional advantages will be apparent to those skilled in the art in the below description with reference to the present figures.

FIG. 1 illustrates a top view of a simplified substrate handling and processing system 100, according to one embodiment. In the depicted embodiment, a front end 102 feeds substrates to a pre-processing chamber 106, which get the substrates flowing into the substrate handling and processing system 100. The pre-processing chamber 106, may perform one of a degas or pre-clean process to ensure the surface of the substrate is clean for further processing. In one embodiment, the front end 102 is a factory interface (also referred to as an equipment front end module (EFEM)) that includes a robot (not shown) for placing substrates into the pre-processing chamber 106 and for removing substrates from the post-processing chamber 126. The front end 102 may include one or more ports, to which cassettes (e.g., front opening unified pods (FOUPs) containing substrates are connected. The robot may retrieve substrates from the cassettes and place substrates into the cassettes.

After a substrate has been pre-processed, the pre-processing chamber 106 may eject the substrate into a first substrate transfer via 110A. The first substrate transfer via 110A may direct and transfer the substrate to a first processing chamber 120A, e.g., which may process the substrate with CVD or PVD, for example. After first processing, the first processing chamber 120A may eject the substrate into a second transfer via 110B. The second transfer via 110B may direct and transfer the substrate to a second processing chamber 120B, which may process the substrate an etch process, for example. After second processing, the second processing chamber 120B may eject the substrate to a third substrate transfer via 110C. The third substrate transfer via 110C may direct and transfer the substrate to a post-processing chamber 126, which may, for example include a post-clean and/or cool down of the processed substrate. After post processing, the post-processing chamber 126 may eject the substrate back to the front end 102.

In some situations, the substrate may undergo a dwell time waiting to enter a processing chamber if processing within the various processing chambers differs in amount of time. The dwell time may be experienced by a substrate within one or more of the substrate transfer vias or one or more of the processing chambers, affecting efficiency and timing arrival of the substrate to a next processing step. When a processing chamber is opened, movement of the substrate that has been processed may be dictated by data analysis that determines an endpoint for the substrate, whether an intermediate endpoint or an ultimate endpoint.

Figure 2A:
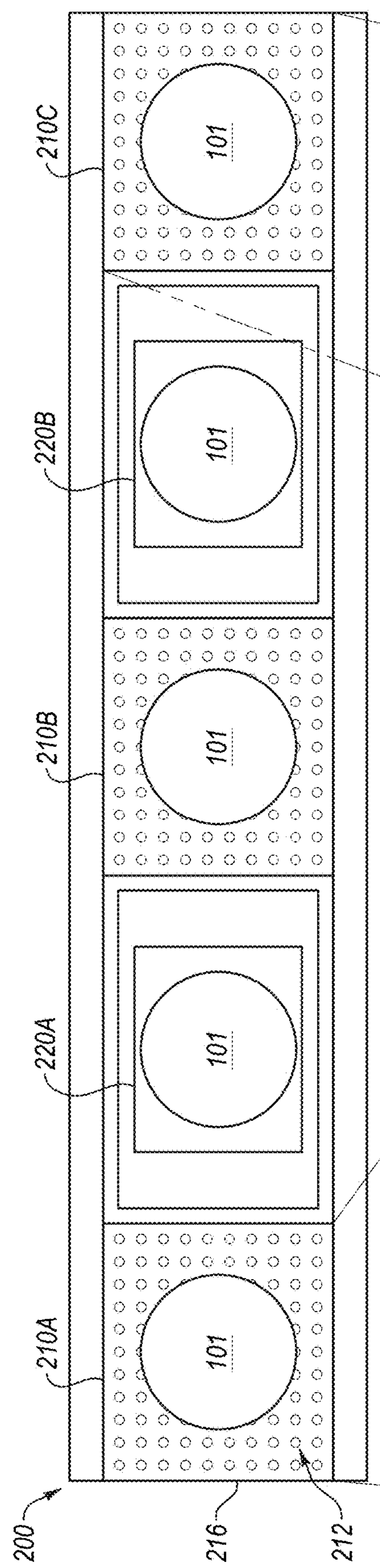
FIG. 2A illustrates a top view of an example section of a substrate handling and processing system, according to an embodiment.

FIG. 2A illustrates a top view of an example section 200 of a substrate handling and processing system, according to an embodiment. The example section 200 includes a first substrate transfer via 210A, followed by a first processing chamber 220A, followed by a second substrate transfer via 210B, followed by a second processing chamber 220B, and followed by a third substrate transfer via 210C. The example section 200 may guide a substrate through the substrate transfer vias 210A, 210B, 210C to and from respective processing chambers 220A and 220B. Each of the substrate transfer vias 210A, 210B, 210C may include a floor 216 that is porous, e.g., that contains multiple apertures 212.

Figure 2C:
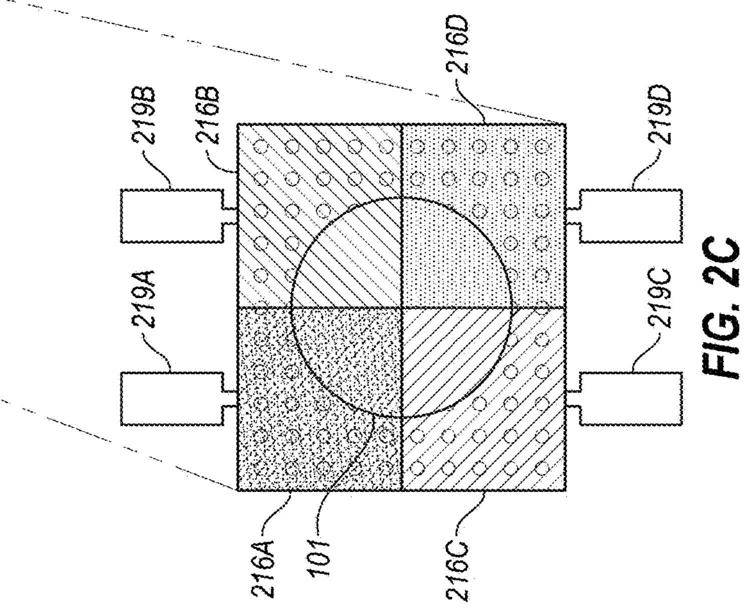
FIG. 2C illustrates a more detailed top view of one of the substrate transfer vias of the substrate handling and processing system of FIG. 2A, according to some embodiments.
Figure 2B:
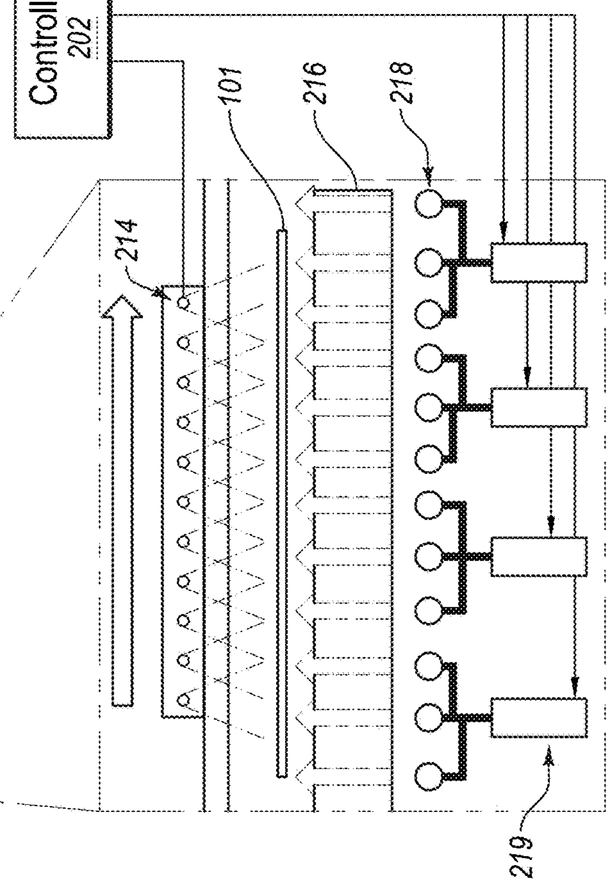
FIG. 2B illustrates a side, cross section view of one of the substrate transfer vias of the substrate handling and processing system of FIG. 2A, according to various embodiments.

FIG. 2B illustrates a side, cross section view of the first substrate transfer via 210A of the substrate handling and processing system of FIG. 2A, according to various embodiments. The first substrate transfer via 210A may be representative of substrate transfer vias disclosed herein. In various embodiments, the first substrate via 210A may include, but not be limited to, a controller 202, a number of position detection sensors 214, the floor 216, multiple gas channels 218 (or gas lines or tubes), and multiple flow-controlled valves 219, e.g., mass flow controlled (MFC) valves. The multiple flow-controlled valves 219 may selectively control the pressure of the gas (e.g., inert gas) flowing out of the multiple gas channels 218 and through the multiple apertures 212 in order to direct the substrate 101 along a path through the first substrate transfer via to the first processing chamber 220A. The multiple gas channels 218 may be positioned within and generally span a width of the floor 216 of the first substrate transfer via 210A.

In various embodiments, the position detection sensors 214 are optical sensors, reflective sensors, pyrometers, a combination thereof, or other imaging sensors. One or more of the position detection sensors 214 may be or include an environmental sensor to collect environmental data such as pressure, temperature, humidity, and the like, which may impact the proper execution of the handling and the processing the substrate, which will be discussed with reference to FIG. 3.

In various embodiments, the position detection sensors 214 include overlapping detection zones and thus work together to track a position of the substrate 101 during transfer through the first substrate transfer via 210A. For example, the position detection sensors 214 may send positioning data to the controller 202 in real time. The controller 202 may then process the positioning data to determine a location of the substrate 101 within the first substrate transfer via 210A. The controller 202 also knows that the destination for the substrate 101 is the first processing chamber 220A. The controller 202 may also be coupled to the multiple flow-controlled valves 219 in order to adjust a pressure of the inert gas from at least some of the multiple flow-controlled valves 219, through the multiple gas channels 218, to move the substrate 101 in a predetermined direction with reference to the location. This predetermined direction may be toward the destination of the first processing chamber 20A that is coupled to the first substrate transfer via.

The positioning data may include attitude, velocity, and location information for the substrate 101, for example. The controller 202 may thus analyze the attitude, velocity, and location information to determine a direction by which to direct the substrate 101 via the multiple flow-controlled valves 219. In one embodiment, the controller 202 may reduce, via controlling the multiple flow-controlled valves 219, the pressure of the inert gas flowing from a first subset of the multiple flow-controlled valves 219 underneath a first side of the substrate 101 disposed in the predetermined direction relative to the substrate. This first subset, for example, may be located nearest to the first processing chamber 220A. The controller 202 may also, e.g., simultaneously increase the pressure of the inert gas flowing from a second subset of the multiple flow-controlled valves 219 located underneath a second side of the substrate that is opposite to the first side of the substrate. The second subset, for example, may be located farthest from the first processing chamber 220A. The increase in pressure at the second side of the substrate (e.g., the side that is opposite the direction in which the substrate is to move) and the decrease in pressure at the first side of the substrate (e.g., the side that is in the direction in which the substrate is to move) causes a pressure differential, which in turn causes the substrate to move in the target direction.

FIG. 2C illustrates a more detailed top view of the third substrate transfer via 210C of the substrate handling and processing system of FIG. 2A, according to some embodiments. The third substrate transfer via 210C may be representative of substrate transfer vias disclosed herein, and may include all of the components that were discussed with reference to the first substrate transfer via 210A.

Because the substrate 101 can drift from a center line through the first substrate transfer via 210A, the controller 202 may also selectively adjust the pressure of the inert gas from a subset of the multiple flow-controlled valves 219 to alter a direction of the substrate 101 with reference to sides of the first substrate transfer via 210A. These additional adjustments may attempt to put the substrate 101 back onto a generally central path through the first substrate transfer via 210A, and in good position for entry into the first processing chamber 220A. Transfer of the substrate 101 into and out of the processing chamber will be discussed in more detail with reference to FIG. 4, FIGS. 5A-5D, and FIGS. 6A-6D.

More specifically, the third substrate via 210C may include a first valve 219A, of the multiple flow-controlled valves 219, coupled to a first side of the multiple channels 218 in a first corner 216A of the third substrate transfer via 210C. The third substrate via 210C may further include a second valve 219B, of the multiple flow-controlled valves 219, coupled to the first side of the multiple gas channels 218 in a second corner 216B of the third substrate transfer via 210C. The third substrate via 210C may further include a third valve 219C, of the multiple flow-controlled valves 219, coupled to a second side of the multiple gas channels 218 in a third corner 216C of the third substrate transfer via 210C opposite to the first corner 216A. The third substrate via 210C may further include a fourth valve 219D, of the multiple flow-controlled valves 219, coupled to the second side of the multiple gas channels 218 in a fourth corner 216D of the third substrate transfer via 210C opposite to the second corner 216B.

In related embodiments, if the substrate 101 is drifting towards the first side of the third substrate transfer via 210C, the controller 202 can increase pressure of the gas to one or both of the first valve 219A and the second valve 219B and/or decrease the pressure of the gas to one or both of the third valve 219C and the fourth valve 219D to push the substrate 101 towards the second side of the third substrate transfer via 210C. If the substrate 101 is drifting towards the second side of the third substrate transfer via 210C, the controller 202 can decrease pressure of the gas to one or both of the first valve 219A and the second valve 219B and/or increase the pressure of the gas to one or both of the third valve 219C and the fourth valve 219D to push the substrate 101 towards the first side of the third substrate transfer via 210C.

Figure 3:
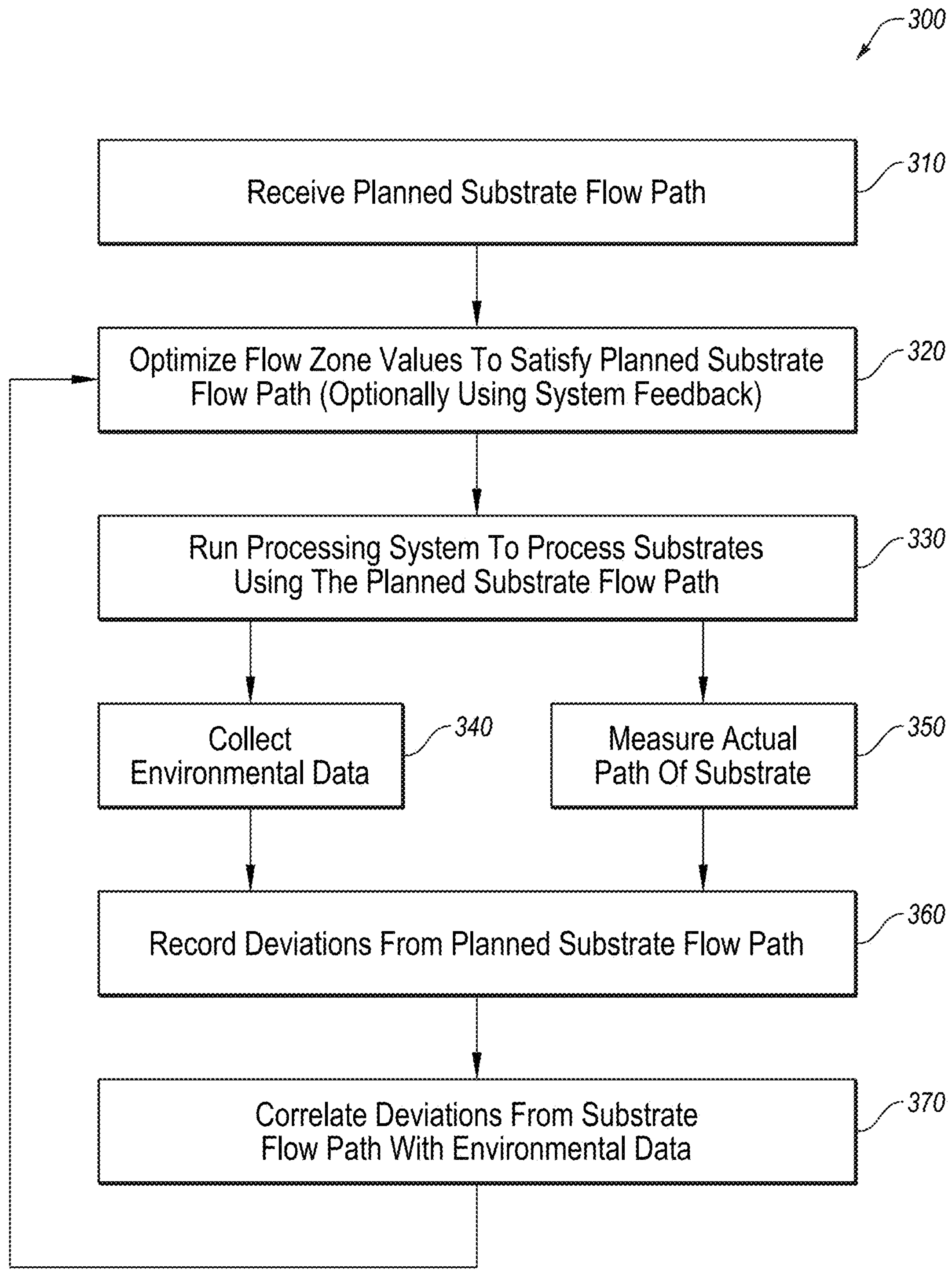
FIG. 3 is a flow chart of a process flow method for transfer of substrates within a substrate handling and processing system, according an embodiment.

FIG. 3 is a flow chart of a process flow method 300 for transfer of substrates within a substrate handling and processing system, according an embodiment. The method 300 may be performed by the controller 202 in conjunction with control of various flow-controlled valves such as those discussed with reference to FIG. 2B and FIG. 2C.

Figure 7A:
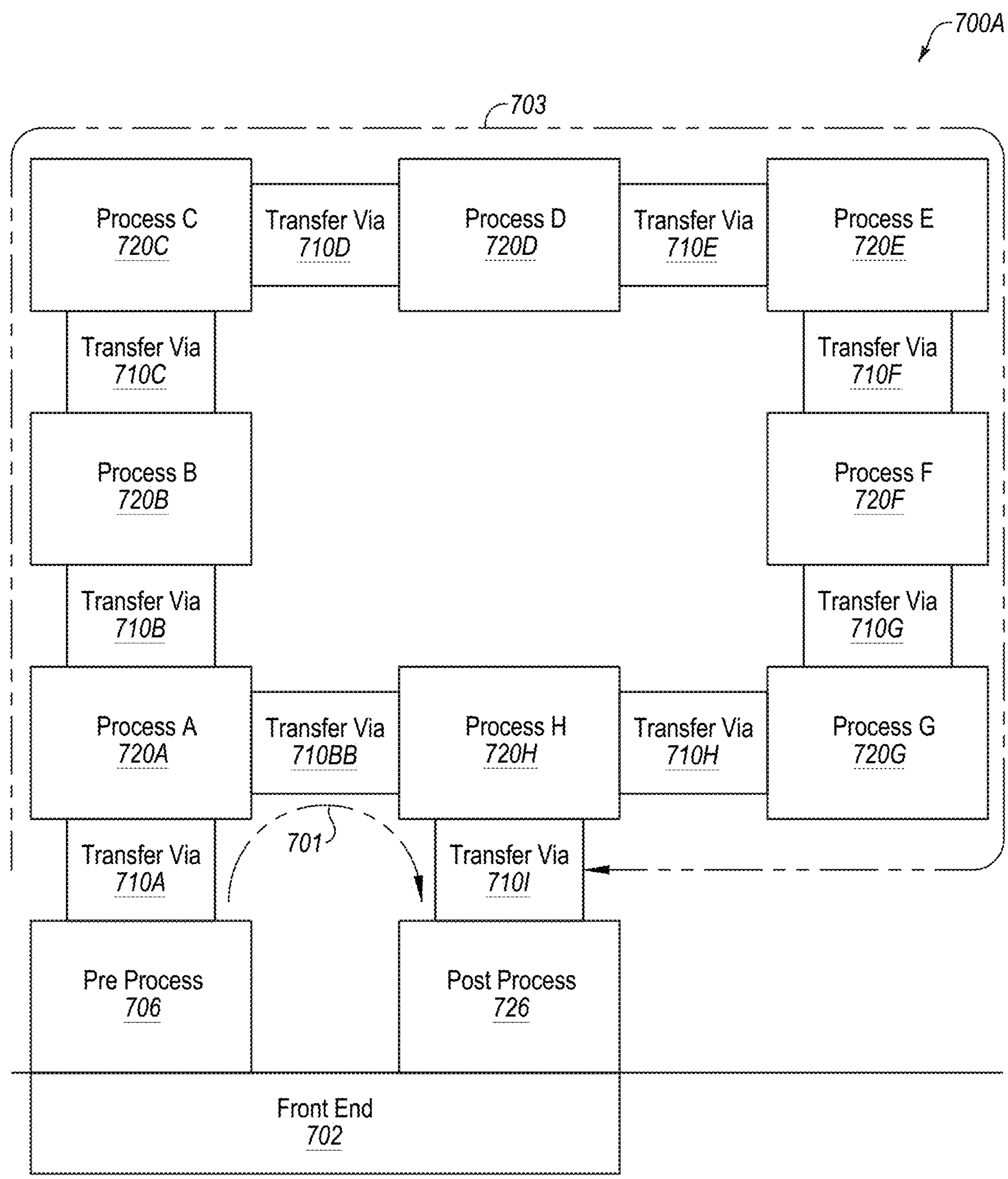
FIG. 7A illustrates a more detailed production configuration of a substrate handling and processing system, according to an embodiment.
Figure 7B:
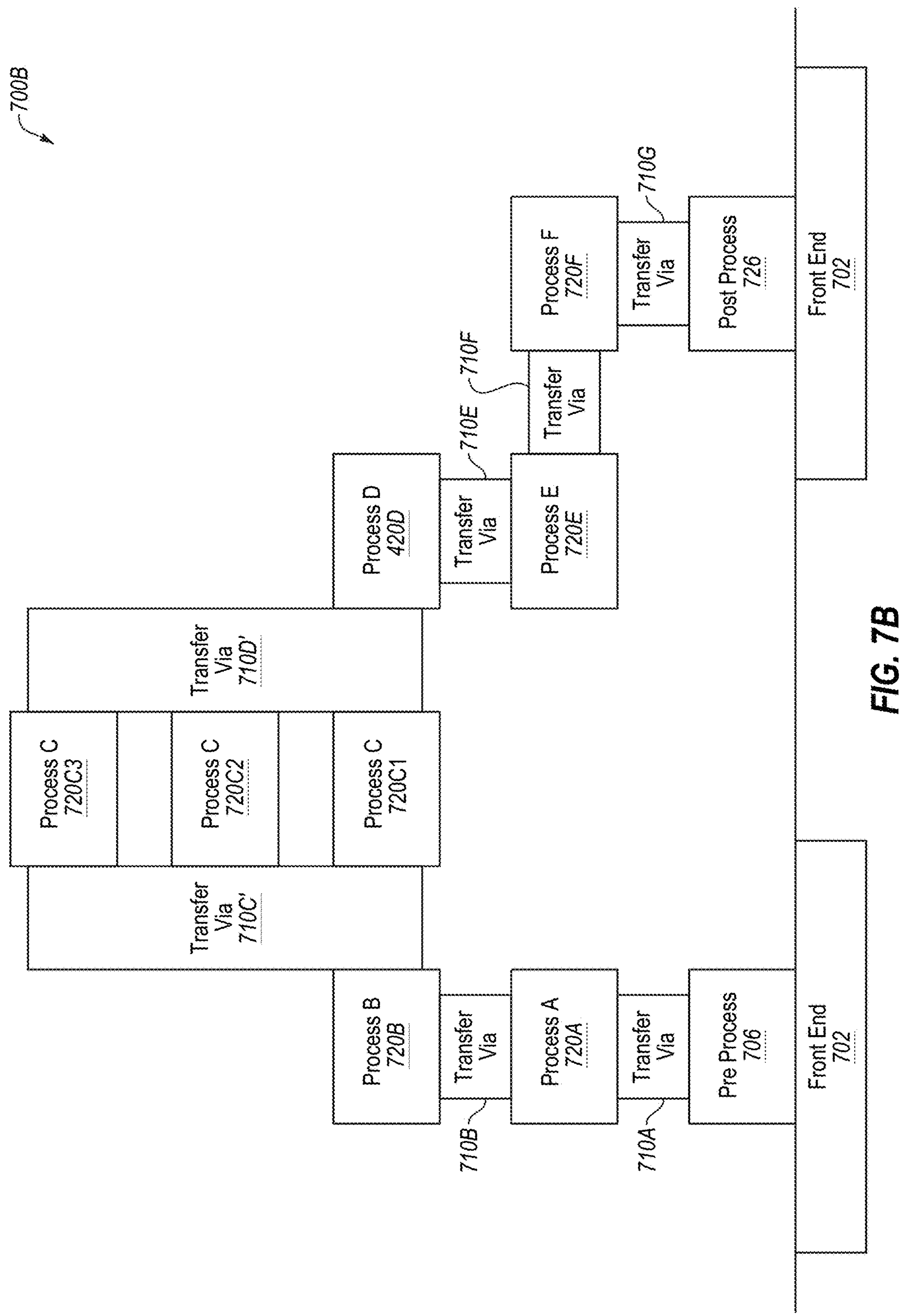
FIG. 7B illustrates an example substrate handling and processing system that includes parallel processing capability, according to an embodiment.

At operation 310, the controller 202 receives a planned substrate flow path, e.g., from a user interface or over a network. The substrate flow path may indicate, in order, which substrate transfer vias a substrate 101 is to take and to which processing chambers to be delivered and processed. The substrate flow path may also indicate a velocity based on processing times and throughput requirements. While only one path is possible in the substrate handling and processing system 100 (FIG. 1), different or parallel paths may be possible as illustrated in FIG. 7A and FIG. 7B, respectively, where different substrate handling and processing systems may be customized for different electronic components being manufactured.

Figure 4:
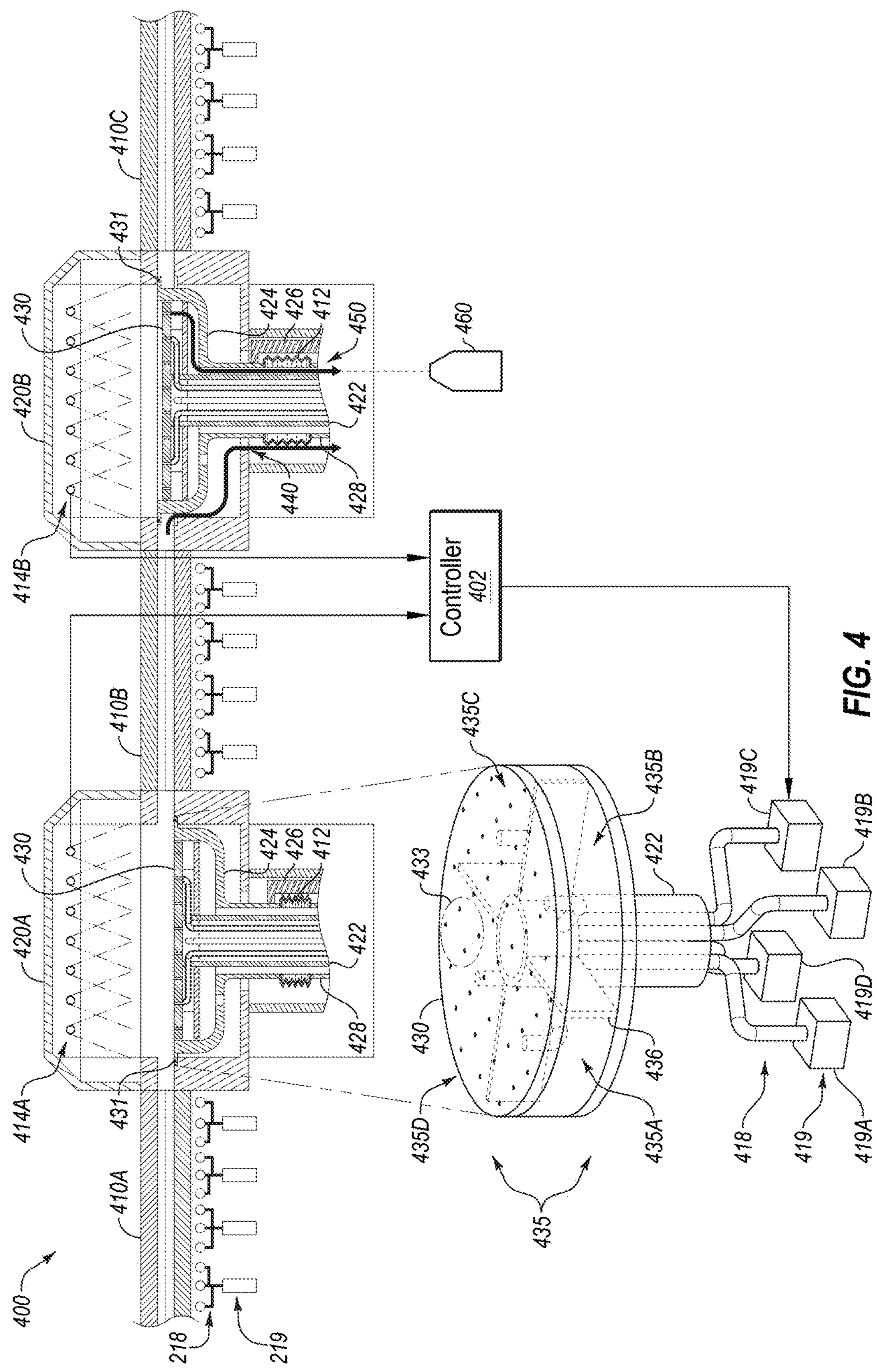
FIG. 4 illustrates a side, cross section view of a section of a substrate handling and processing system, according to one various embodiments.

At operation 320, the controller 202 optimizes flow zone values to satisfy the planned substrate flow path. The flow zone values may direct particular ones of the flow-controlled valves (whether within the substrate transfer vias such as illustrated in FIGS. 2A-2C or within the processing chambers as illustrated in FIG. 4) at particular pressures in order to direct the substrate 101 through the planned substrate flow path.

At operation 330, the controller 202 may run the substrate handling and processing system to process the substrate using the planned substrate flow path. More than one substrate may be handled and processed using this plan.

At operation 340, the controller 202 may collect environmental data such as pressure, temperature, humidity, and the like, which may impact the proper execution of the handling and the processing the substrate. At operation 350, the controller 202 may also, with the help of the position detection sensors 214, measure or determine the actual path of the substrate, e.g., which may include processing actual positioning data associated with the substrate.

At operation 360, the controller 202 may record deviations of the actual path from the planned substrate flow path. At operation 370, the controller 202 may correlate such deviations with the environmental data, to be able to learn impact of the environment on the substrate flow path that may need to considered and for which adjustments to future planned substrate flow paths may be made. The method 300 then returns to block 320 in embodiments to update the flow zone values. This process may repeat until a substrate is no longer being moved (e.g., until it exits a substrate transfer via).

FIG. 4 illustrates a side, cross section view of a section 400 of a substrate handling and processing system, according to various embodiments. The section 400 of the substrate handling and processing system may include, for example, a first substrate transfer via 410A, followed by a first processing chamber 420A, a second substrate transfer via 410B, followed by a second processing chamber 420B, followed by a third substrate transfer via 410C. As in FIG. 2A, each of the substrate transfer vias may include multiple gas channels 218 and multiple flow-controlled valves 219, all controllable by a controller 402. For purposes of explanation, the first processing chamber 420A may be assumed to be functionally identical to the second processing chamber 420B despite some features being illustrated with respect to one or the other. The processing chambers 420A, 420B, however, may be different in being configured for different types of processes.

The processing chambers 420A and 420B may also include a number of position detection sensors 414A and 414B, respectively, which may be adapted to sense a location or position of a substrate and send positioning data to the controller 402. One or more of each of the position detection sensors 414A and 414B may be or include an environmental sensor to collect environmental data such as pressure, temperature, humidity, and the like. Alternatively, distinct environmental sensors may be used to sense each of these environmental parameters. Each of the processing chambers may also include one or more gas channels 418 (e.g., gas lines) connected to one or more corresponding flow-controlled devices 419. The processing chambers 420A, 420B may further include a pedestal 430 having a number of apertures 433, and thus the pedestal may be porous as is the floor 216 of the substrate transfer vias. The pedestal 430 may include a first post 422 through which the one or more gas channels 418 are inserted.

The controller 402 may detect that the substrate is at an entrance to the first processing chamber 420A, e.g., by one of the position detection sensors 414A closest to the entrance. In one embodiment, the flow-controlled devices 419 of the first processing chamber 420A injects inert gas via the one or more gas channel 418 and through the apertures 433 in the pedestal 430 when a substrate enters the processing chamber 420A in order to receive the substrate onto the pedestal 430. The flow-controlled devices 419 may include valves, mass flow controllers, piezoelectric flow controllers, or similar valves and control devices, or a combination thereof. The flowed gas may cause the substrate to drift or float above the pedestal. In one embodiment, the pedestal is shaped to direct the flowed gas in such a manner that the substrate becomes centered on the pedestal.

In an example, the controller 402 may cycle the flow-controlled devices 419 a first time to receive the substrate. The flow-controlled devices 419 may further inject inert gas via the one or more gas channel 418 and through the apertures 433 of the pedestal 430 to eject (or move) the substrate from the pedestal 430, e.g., into the second substrate transfer via 410B after processing of the substrate. For example, the controller 402 may cycle the flow-controlled valve a second time to eject the substrate.

In another embodiment, the pedestal 430 is partitioned (e.g., with a partition structure 436) into multiple flow-controlled zones 435, which are monitored by the multiple position detection sensor 414A, respectively. By way of example, as illustrated, the multiple flow-controlled zones 435 may include a first zone 435A, a second zone 435B, a third zone 435C, and a fourth zone 435D. Fewer or additional zones are envisioned. The one or more gas channels 418 may include a gas channel for each zone inserted through the first post 422 and connected to a respective flow-controlled devices of the a set of the flow-controlled devices 419, e.g., a first flow-controlled valve 419A, a second flow controlled valve 419B, a third flow-controlled valve 419C, and a fourth flow-controlled valve 419D. The controller 402 may determine, from sensing data received from one or more of the position detection sensors 414A or 414B, the position of the substrate with respect to a center of the pedestal 130. The controller 402 may then selectively initiate the multiple flow-controlled devices 419 to direct a center of the substrate onto the center of the pedestal.

In various embodiments, each processing chamber 420A and 420B further includes a lower enclosure 424 having a second post 428. The lower enclosure 424 may be shaped as a bowl having a lip in one embodiment, although other shapes such as an open-ended box are also envisioned. The first post 422 may be positioned within the second post 428. The lower enclosure 424 may be adapted to receive the pedestal 430 or be coupled to an underside of the pedestal 430. A lift 426 may be adapted to raise the pedestal 430 into the processing chamber, e.g., so that the substrate resting on the pedestal 430 may be processed by the processing chamber 420A or 420B. To do so, the lift 426 may be physically connected to one of the lower enclosure 424 or the second post 428 and adapted to lift the lower enclosure 424 and second post 428 as a unit. The lift 426 may be a mechanical lift, a magnetic lift, a pneumatic lift, or the like. In one embodiment, the second post 428 includes (or is integrated with) a bellows 412 that expands when the lower enclosure 424 and the second post 428 are raised to the processing chamber and that contracts when the lower enclosure 424 and second post 428 are lowered. For example, the lift 426 of the first processing chamber 420A is in the down position while the lift 426 of the second processing chamber 420B is in the up position. A circular seal 431 may be positioned on an upper circumference (e.g., on the lip) of the lower enclosure 424 to seal the lower enclosure 424 to an underside of the processing chamber when in the up position.

In related embodiments, while substrates move throughout the substrate handling system, the lower enclosure 424 may be in the lifted, sealed position. A recirculation channel 440 may be positioned to an outside of the second post 428 to recirculate inert gas, e.g., received from the first substrate via 410A and the second substrate via 410B (for the first processing chamber 420A) or received from the second substrate transfer via 410B and the third substrate transfer via 410C (for the second processing chamber 420B).

In various embodiments, each processing chamber 420A and 420B further includes an exhaust channel 450 formed within the second post 428 to purge process waste after processing. In one embodiment, the exhaust channel 450 is circular and is formed between the first post 422 and the second post 428. A vacuum source 460 may be coupled to the exhaust channel 450 to adjust a pressure level of the processing chamber. When preparing to undergo processing in the first processing chamber 420A, for example, the controller 402 may raise the lower enclosure 424 until in a sealing position against an underside of a cavity of the first processing chamber 420A. The controller 402 may further control the vacuum source 460 to pressurize the first processing chamber 420A and then initiate the processing of the substrate.

In these embodiments, upon termination of the processing, the controller 402 is further to lower the lower enclosure 424. The controller 402 may further cause a purge of process waste from the first processing chamber through the exhaust channel 450, e.g., via activation of the vacuum source 460. The controller 402 may further control the vacuum source 460 to adjust the pressure level to substantially match a first pressure level of the second substrate transfer via 410B, and selectively initiate the multiple flow-controlled valves 419 to eject the substrate into the second substrate transfer via 410B.

Figure 5B:
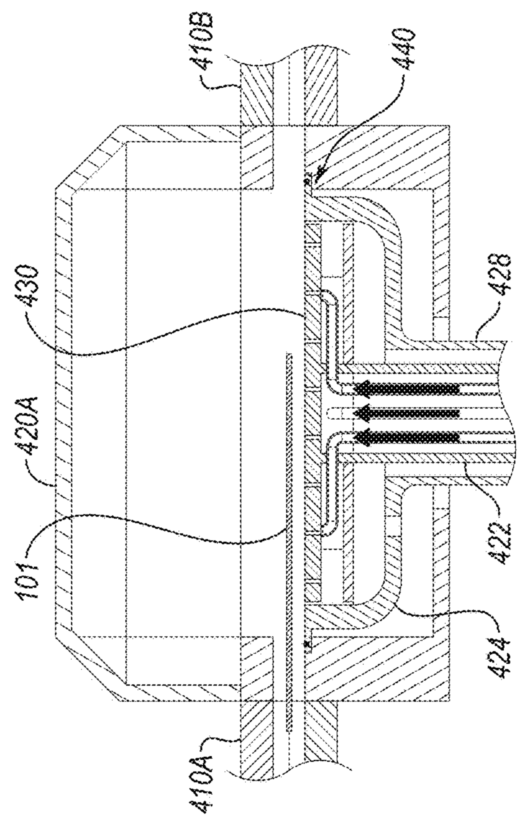
FIGS. 5A-5D illustrate a series of processing steps from a side, cross section view of one of the processing chambers of the substrate handling and processing system, according to various embodiments.
Figure 5D:
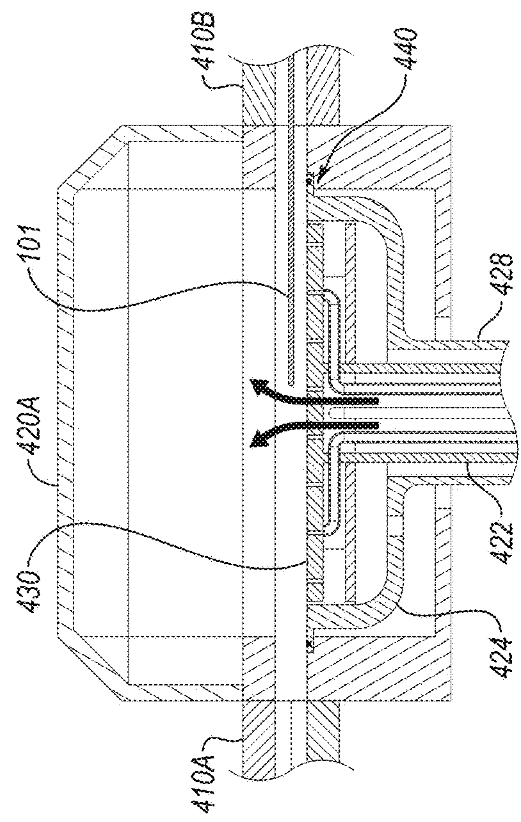
Figure 5A:
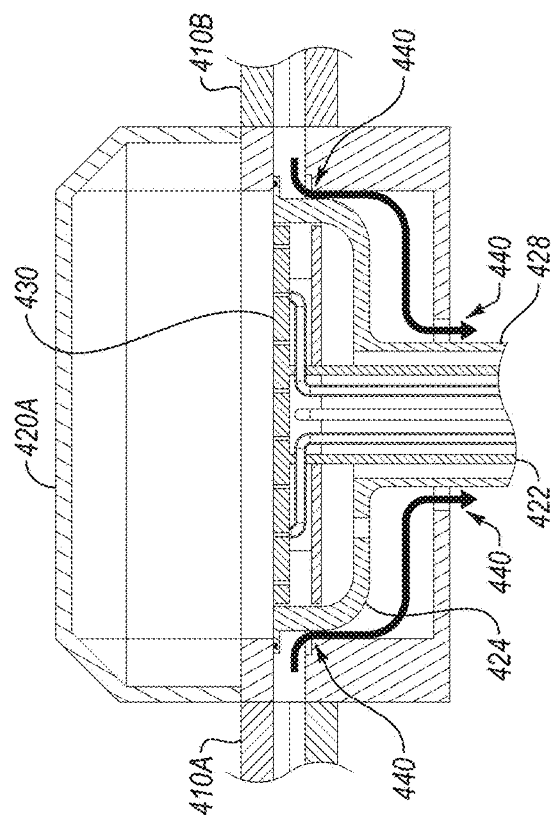

FIGS. 5A-5D illustrate a series of processing steps from a side, cross section view of one of the processing chambers of the substrate handling and processing system, according to various embodiments. FIGS. 6A-6D illustrates a series of processing steps from a perspective view of one of the processing chambers of the substrate handling and processing system, according to various embodiments. For purposes of explanation, the first processing chamber 420A of FIG. 4 is illustrated. With reference to FIG. 5A, while a substrate 101 moves through the substrate handling and processing system, the lower enclosure 424 and second post 428 may remain in an up position, sealed against the backside of the cavity of the first processing chamber 420A. The inert gas within the system from moving the substrate 101 to the first processing chamber 420A may be recirculated through the recirculation channel 440, as illustrated by the dark arrows in FIG. 5A.

Figure 6B:
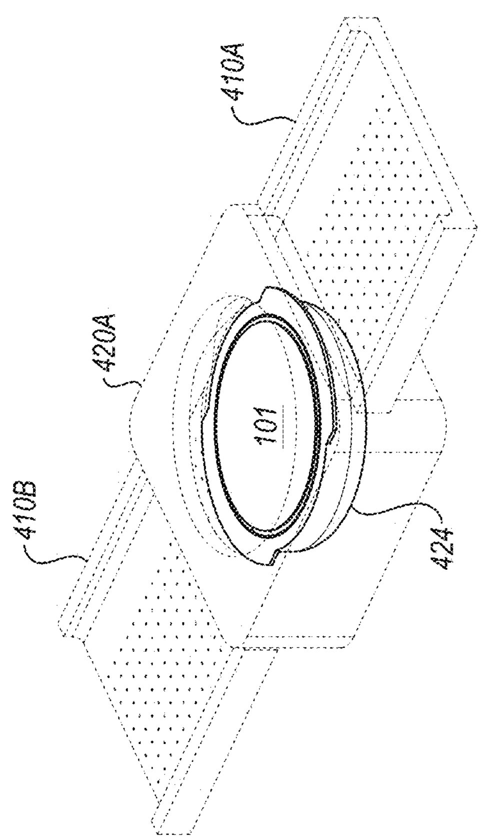
FIGS. 6A-6D illustrates a series of processing steps from a perspective view of one of the processing chambers of the substrate handling and processing system, according to various embodiments.
Figure 6D:
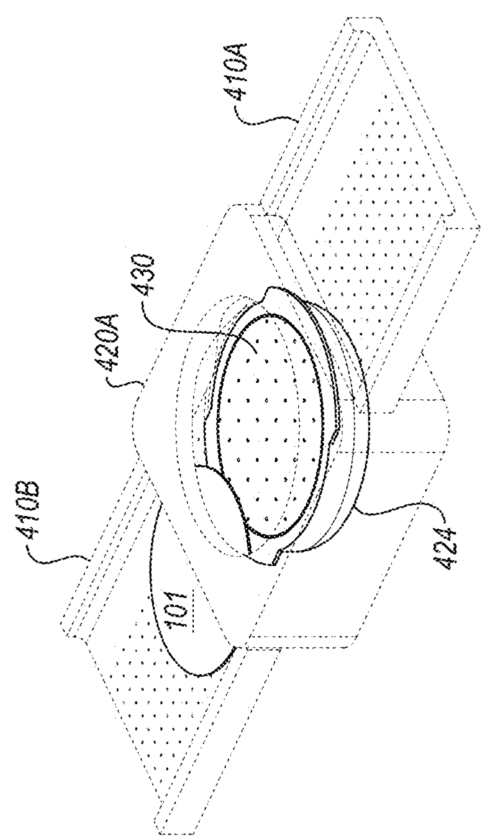
Figure 6A:
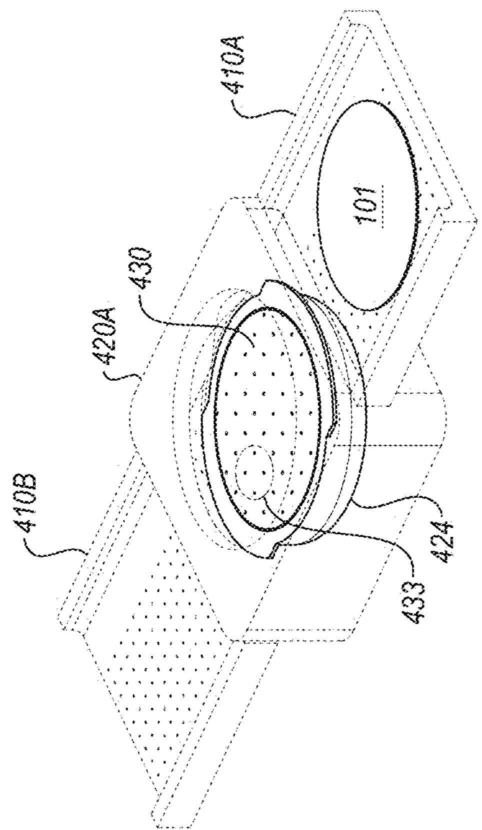

With reference to FIGS. 5B and 6A-6B, the lower enclosure 424 may be lowered, e.g., to the down position in order to receive the substrate 101 from the first substrate transfer via 410A. The controller 402 may activate the one or more flow-controlled valves 419 to inject inert gas, e.g., via corresponding gas channels 418, through the apertures 433 of the pedestal 430. The controller 402 may adjust the pressure of the injection of the inert gas by the flow-controlled valves 419 to control reception of the substrate 101 as the substrate 101 is lowered onto the pedestal 430. Different embodiments with differing levels of control of the flow-controlled valves 419 was discussed with reference to FIG. 4. The injection of the inert gas is illustrated with dark black arrows in FIG. 5B, and the substrate 101 is shown flowing into the first processing chamber in FIGS. 5B and 6A. The result of this control is illustrated in FIG. 6B, with substrate 101 at rest on pedestal 430.

Figure 5C:
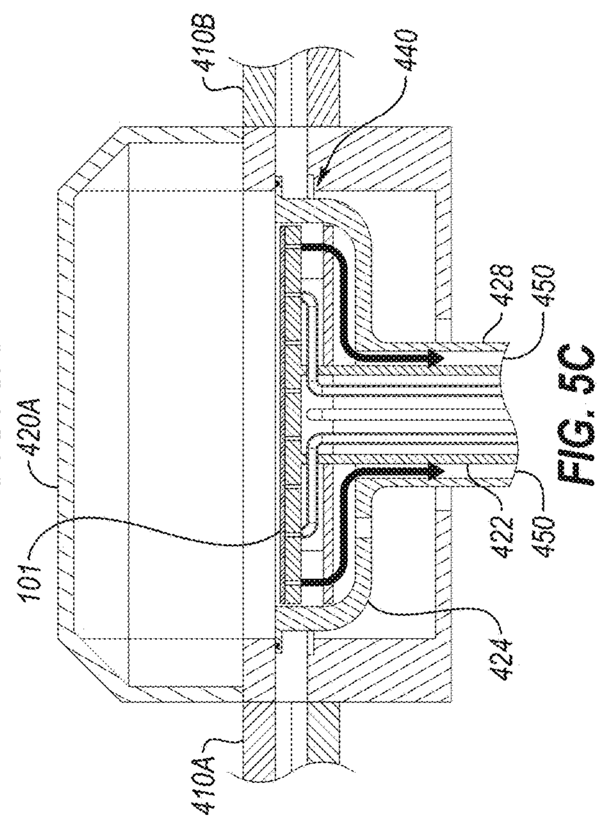
Figure 6C:
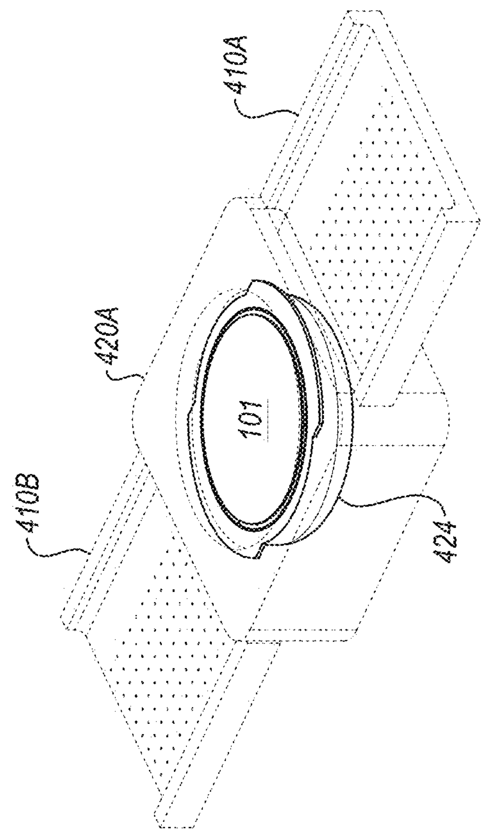

With reference to FIGS. 5C and 6C, the lower enclosure 424 may again be raised into the up position, sealed against the backside of the cavity of the first processing chamber 420A, and the substrate 101 inserted into the first processing chamber 420A. The controller 402 may further control the vacuum source 460 to pressurize the first processing chamber 420A to a first pressure level appropriate for processing. The controller 402 may then initiate processing by the first processing chamber 420A, e.g., to process the substrate 101. During and after processing, the first processing chamber 420 may purge process waste through the exhaust channel 450, as illustrated with dark black arrows in FIG. 5C.

With reference to FIGS. 5D and 6D, the controller 402 may receive, from a pressure sensor, a detected second pressure level in at least one of the first substrate transfer via 410A or the second substrate transfer via 410B. The controller 402 may further control the vacuum source 460 to adjust the first pressure level to substantially match the second pressure level, e.g., in preparation to transfer the substrate 101 out of the first processing chamber 420A. The controller 402 may further lower the lower enclosure 424 and the second post 428. The controller 402 may then activate the one or more flow-controlled devices 419, which inject inert gas through the pedestal 430 to move the substrate into the second substrate transfer via 410B. The injection of the inert gas through the pedestal 430 to move the substrate 101 from the first processing chamber 420A into the second substrate transfer via 410B is illustrated with dark black arrows in FIG. 5D.

FIG. 7A illustrates a more detailed production configuration of a substrate handling and processing system 700A, according to an embodiment. The system 700A, for example, may include a front end 702 that feeds substrates to a pre-processing chamber 706, which get the substrates flowing into the substrate handling and processing system 700A. After a substrate has been pre-processed, the pre-processing chamber 706 may eject the substrate into a first substrate transfer via 710A. The substrate may then be processed via one of a short path 701 or a long path 703. The short path may include processing chambers 720A and 720H interposed by substrate transfer vias 710BB and 710I, as illustrated, before being post processed in a post processing chamber 726.

The long path 703 may include processing chambers 720A, 720B, 720C, 720D, 720E, 720F, 720G, and 720H, interposed by substrate transfer vias 710B, 710C, 710D, 710F, 710G, 710H, and 710I, as illustrated, before being post processed in the post processing chamber 726. Once the substrate is processed via the short path 701 or the long path 703 of the substrate handling and processing system 700A, the substrate is transferred back to the front end 702 and into one of a substrate carrier or a side storage pod.

FIG. 7B illustrates an example substrate handling and processing system 700B that includes parallel processing capability, according to an embodiment. The system 700B, for example, may include the front end 702 that feeds substrates to the pre-processing chamber 706, which get the substrates flowing into the substrate handling and processing system 700B. After a substrate has been pre-processed, the pre-processing chamber 706 may eject the substrate(s) into a first substrate transfer via 710A, one at a time. The substrates may then be processed via the substrate handling and processing system 700B, e.g., going through processing chambers 720A, 720B, one of 720C1, 720C2, or 720C3, then 720D, and 720F, interposed by substrate transfer vias 710A, 710B, 710C', 710D', 710E, 710F, and 710G. The processing chambers 720A and 720B are parallel processing chambers and adapted to concurrently perform the same process, or substantially the same process, on multiple substrates at the same time.

The substrate transfer vias 710C' and 710D' may each be multi-substrate transfer vias that may receive and direct multiple substrates at a time. For example, a first substrate may be directed to processing chamber 720C3, a second substrate may be directed to processing chamber 720C2, and a third substrate may be directed to processing chamber 720C1. Two of the substrates may need to be delayed within the substrate transfer via 710D' long enough to directed through processing chamber 720D. Once the substrate(s) have been processed, the substrate handling and processing system 700A, the substrate(s) are transferred back to the front end 702 and into one of a substrate carrier or a side storage pod.

As can be seen in FIGS. 7A and 7B, the substrate handling and processing systems disclosed herein may be customized via a flexible, extendable architecture in which substrates transfer vias may be joined with a number of different processing chambers sufficient to process the substrates in a pre-planned way. These substrate transfer vias and processing chambers may be intermixed in creative ways to, in some cases, process substrates for more than one electronic component or product with a single system setup.

Figure 8:
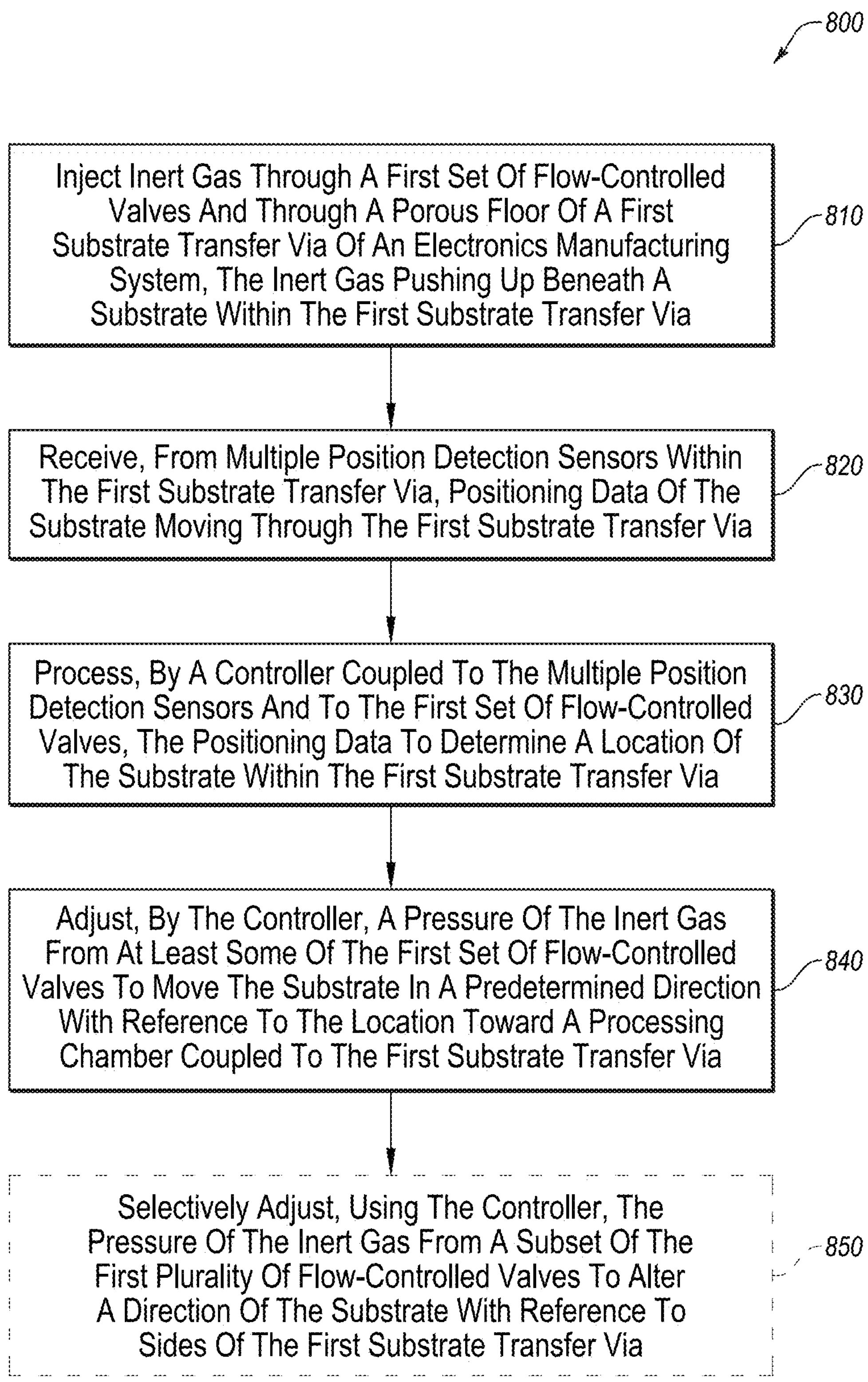
FIG. 8 is a flow chart of a method for using a substrate transfer via for transferring a substrate to a processing chamber, according to one aspect of the disclosure.

FIG. 8 is a flow chart of a method 800 for using a substrate transfer via for transferring a substrate to a processing chamber, according to one aspect of the disclosure. The method 800 may be performed by one of the substrate transfer vias disclosed herein and one of the controllers herein as well. At operation 810, the method 800 may begin with injecting inert gas through a first set of flow-controlled valves and through a porous floor of a first substrate transfer via of an electronics manufacturing system, the inert gas pushing up beneath a substrate within the first substrate transfer via. At operation 820, the method 800 may include receiving, from multiple position detection sensors within the first substrate transfer via, positioning data of the substrate moving through the first substrate transfer via. At operation 830, the method 800 may include processing, by a controller coupled to the multiple position detection sensors and to the first set of flow-controlled valves, the positioning data to determine a location of the substrate within the first substrate transfer via. At operation 840, the method 800 may include adjusting, by the controller, a pressure of the inert gas from at least some of the first set of flow-controlled valves to move the substrate in a predetermined direction with reference to the location toward a processing chamber coupled to the first substrate transfer via. At operation 850, the method 800 may optionally further include selectively adjusting, using the controller, the pressure of the inert gas from a subset of the first plurality of flow-controlled valves to alter a direction of the substrate with reference to sides of the first substrate transfer via.

The preceding description sets forth numerous specific details such as examples of specific systems, components, methods, and so forth in order to provide a good understanding of several embodiments of the present disclosure. It will be apparent to one skilled in the art, however, that at least some embodiments of the present disclosure may be practiced without these specific details. In other instances, well-known components or methods are not described in detail or are presented in simple block diagram format in order to avoid unnecessarily obscuring the present disclosure. Thus, the specific details set forth are merely exemplary. Particular implementations may vary from these exemplary details and still be contemplated to be within the scope of the present disclosure.

Reference throughout this specification to “one embodiment” or “an embodiment” means that a particular feature, structure, or characteristic described in connection with the embodiment is included in at least one embodiment. Thus, the appearances of the phrase “in one embodiment” or “in an embodiment” in various places throughout this specification are not necessarily all referring to the same embodiment. In addition, the term “or” is intended to mean an inclusive “or” rather than an exclusive “or.” When the term “about” or “approximately” is used herein, this is intended to mean that the nominal value presented is precise within ±10%.

Although the operations of the methods herein are shown and described in a particular order, the order of operations of each method may be altered so that certain operations may be performed in an inverse order so that certain operations may be performed, at least in part, concurrently with other operations. In another embodiment, instructions or sub-operations of distinct operations may be in an intermittent and/or alternating manner.

It is understood that the above description is intended to be illustrative, and not restrictive. Many other embodiments will be apparent to those of skill in the art upon reading and understanding the above description. The scope of the disclosure should, therefore, be determined with reference to the appended claims, along with the full scope of equivalents to which such claims are entitled.

What is claimed is:

1. An electronics manufacturing system comprising:

a first substrate transfer via comprising:

a plurality of position detection sensors to detect a position of a substrate in the first substrate transfer via; and a plurality of flow-controlled valves configured to:

inject inert gas through a floor of the first substrate transfer via; and move the substrate in a predetermined direction with reference to the position within the first substrate transfer via by adjusting a pressure of the inert gas underneath the substrate;

a controller coupled to the plurality of flow-controlled valves and to the plurality of position detection sensors, the controller to:

receive sensing data indicating the position of the substrate from the plurality of position detection sensors; and control the plurality of flow-controlled valves based on the sensing data;

a processing chamber coupled to the first substrate transfer via, the processing chamber comprising:

a pedestal comprising a plurality of apertures; and a plurality of flow-controlled devices to:

inject inert gas through the plurality of apertures to receive the substrate from the first substrate transfer via; and move the substrate into a second substrate transfer via after processing of the substrate.

2. The electronics manufacturing system of claim 1, wherein the floor is porous, and wherein the first substrate transfer via comprises:

a plurality of channels positioned within and spanning substantially a width of the floor of the first substrate transfer via, the plurality of channels to carry the inert gas into the first substrate transfer via;

a first valve, of the plurality of flow-controlled valves, coupled to a first side of the plurality of channels in a first corner of the first substrate transfer via;

a second valve, of the plurality of flow-controlled valves, coupled to the first side of the plurality of channels in a second corner of the first substrate transfer via;

a third valve, of the plurality of flow-controlled valves, coupled to a second side of the plurality of channels in a third corner of the first substrate transfer via opposite to the first corner; and a fourth valve, of the plurality of flow-controlled valves, coupled to the second side of the plurality of channels in a fourth corner of the first substrate transfer via opposite to the second corner.

3. The electronics manufacturing system of claim 1, wherein the controller is further to:

reduce the pressure of the inert gas flowing from a first subset of the plurality of flow-controlled valves underneath a first side of the substrate disposed in the predetermined direction relative to the substrate; and increase the pressure of the inert gas flowing from a second subset of the plurality of flow-controlled valves located underneath a second side of the substrate opposite to the first side of the substrate.

4. The electronics manufacturing system of claim 1, wherein the processing chamber further comprises:

a lower enclosure that is sized to receive the pedestal;

a lift physically attached to the lower enclosure, the lift adapted to raise the lower enclosure and pedestal into the processing chamber;

an exhaust channel, formed at least in part within the lower enclosure, to purge process waste after processing; and a vacuum source coupled to the exhaust channel, the vacuum source to adjust a first pressure level of the processing chamber.

5. The electronics manufacturing system of claim 4, further comprising a controller coupled to the plurality of position detection sensors and to the processing chamber, the controller to:

detect that the substrate is at an entrance to the processing chamber;

operate the plurality of flow-controlled devices to receive the substrate onto the pedestal;

raise, using the lift, the lower enclosure until into a sealing position against a backside of a cavity of the processing chamber;

control the vacuum source to pressurize the processing chamber; and initiate processing of the substrate.

6. The electronics manufacturing system of claim 5, further comprising:

the second substrate transfer via coupled to the processing chamber; and a pressure sensor to detect a second pressure level within the first substrate transfer via and the second substrate transfer via;

wherein, upon termination of processing, the controller is further to:

lower the lower enclosure;

cause a purge of process waste from the processing chamber through the exhaust channel;

control the vacuum source to adjust the first pressure level to substantially match the second pressure level; and operate the plurality of flow-controlled devices to move the substrate into the second substrate transfer via.

7. The electronics manufacturing system of claim 1, wherein the processing chamber further comprises:

a set of second position detection sensors;

wherein the plurality of apertures of the pedestal are partitioned into a set of flow-controlled zones that are monitored by the set of second position detection sensors, respectively; and wherein the plurality of flow-controlled devices comprise a distinct flow-controlled device corresponding to each respective zone of the set of flow-controlled zones.

8. The electronics manufacturing system of claim 7, further comprising a controller coupled to the set of second position detection sensors and to the processing chamber, the controller to:

determine, according to the set of flow-controlled zones from sensing data received from the set of second position detection sensors, a second position of the substrate within the processing chamber with reference to a center of the pedestal; and selectively initiate ones of the plurality of flow-controlled devices, depending on the second position, to direct a center of the substrate to be received at the center of the pedestal.

9. A processing chamber comprising:

a pedestal comprising a plurality of apertures, the pedestal sized to receive a substrate and comprising a first post;

a set of flow-controlled devices configured to:

inject inert gas, via the first post, through the plurality of apertures of the pedestal to receive the substrate on the pedestal from a first substrate transfer via for processing; and inject inert gas, via the first post, through the plurality of apertures of the pedestal to eject the substrate from the pedestal into a second substrate transfer via after processing of the substrate;

a position detection sensor to detect a position of the substrate over the pedestal;

a controller coupled to the position detection sensor and to the set of flow-controlled devices, the controller to:

receive sensing data indicating the position of the substrate from the position detection sensor; and control the set of flow-controlled devices based on the sensing data;

a lower enclosure comprising a second post, the lower enclosure adapted to receive the pedestal;

a lift physically connected to one of the lower enclosure or the second post, the lift to raise the lower enclosure and the pedestal into the processing chamber; and an exhaust channel, formed within the second post, to purge process waste after processing.

10. The processing chamber of claim 9, wherein the first post is located within the second post, further comprising:

a bellows integrated within the second post, the bellows to expand when the lift raises the lower enclosure and to contract when the lift lowers the lower enclosure;

a circular seal positioned on an upper circumference of the lower enclosure to seal the lower enclosure to an underside of the processing chamber; and a recirculation channel positioned to an outside of the second post to recirculate inert gas received from the first substrate via and the second substrate via.

11. The processing chamber of claim 9, wherein the exhaust channel is located outside of the first post, further comprising:

a vacuum source coupled to the exhaust channel, the vacuum source to adjust a pressure level of the processing chamber; and wherein the controller is further coupled to the vacuum source and is further to:

determine, from the sensing data received from the position detection sensor, the position of the substrate with respect to a center of the pedestal;

selectively initiate the set of flow-controlled devices to direct a center of the substrate onto the center of the pedestal;

raise, using the lift, the lower enclosure until in a sealing position against an underside of a cavity of the processing chamber;

control the vacuum source to pressurize the processing chamber; and initiate the processing of the substrate.

12. The processing chamber of claim 11, wherein the position detection sensor is one of a set of position detection sensors, wherein the plurality of apertures of the pedestal are partitioned into a set of flow-controlled zones that are monitored by the set of position detection sensors, and wherein the set of flow-controlled devices include a flow-controlled device corresponding to each respective zone of the set of flow-controlled zones.

13. The processing chamber of claim 12, wherein the controller is further to:

determine, based on sensing data from the set of position detection sensors and according to the set of flow-controlled zones, the position of the substrate with respect to a center of the pedestal; and selectively initiate ones of the set of flow-controlled devices, depending on the position, to direct the substrate to be received at the center of the pedestal.

14. The processing chamber of claim 11, wherein, upon termination of processing, the controller is further to:

lower, using the lift, the lower enclosure;

cause a purge of process waste from the processing chamber through the exhaust channel;

control the vacuum source to adjust the pressure level to substantially match a first pressure level of the second substrate transfer via; and selectively initiate the set of flow-controlled devices to eject the substrate into the second substrate transfer via.

* * * * *